(12) United States Patent
Higby et al.

(10) Patent No.: US 12,414,229 B2
(45) Date of Patent: Sep. 9, 2025

(54) TEARING SECURITY FEATURE OF PRINTED CIRCUIT SUBSTRATES

(71) Applicant: INTERNATIONAL BUSINESS MACHINES CORPORATION, Armonk, NY (US)

(72) Inventors: Arthur J. Higby, Cottekill, NY (US); David Clifford Long, Wappingers Falls, NY (US); James Busby, New Paltz, NY (US); William Santiago-Fernandez, Hopewell Junction, NY (US); John R. Dangler, Rochester, MN (US); Russell A. Budd, North Salem, NY (US); Philipp K Buchling Rego, Wappingers Falls, NY (US); Hannah Wendling, Poughquag, NY (US); Lauren Boston, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 353 days.

(21) Appl. No.: 17/963,138

(22) Filed: Oct. 10, 2022

(65) Prior Publication Data
US 2024/0121890 A1 Apr. 11, 2024

(51) Int. Cl.
*H05K 1/02* (2006.01)
*H05K 1/18* (2006.01)
*H05K 5/02* (2006.01)

(52) U.S. Cl.
CPC ......... *H05K 1/0275* (2013.01); *H05K 1/0292* (2013.01); *H05K 1/181* (2013.01); *H05K 5/0208* (2013.01); *H05K 2201/0909* (2013.01)

(58) Field of Classification Search
CPC .. H05K 1/0275; H05K 5/0208; H05K 1/0292; H05K 1/181; H01L 23/57
See application file for complete search history.

(56) References Cited

U.S. PATENT DOCUMENTS

| 7,007,171 | B1 | 2/2006 | Butturini |
| 7,978,070 | B2 | 7/2011 | Hunter |

(Continued)

FOREIGN PATENT DOCUMENTS

| CN | 104105335 A | 10/2014 |
| CN | 114630521 A | 6/2022 |

(Continued)

OTHER PUBLICATIONS

"Patent Cooperation Treaty PCT International Search Report", Applicant's File Reference: PF230535PCT, International Application No. PCT/CN2023/123540, International Filing Date: Oct. 9, 2023, Date of Mailing: Dec. 21, 2023, 9 pages.

(Continued)

*Primary Examiner* — Timothy J Thompson
*Assistant Examiner* — Aditya Sharma
(74) *Attorney, Agent, or Firm* — Michael O'Keefe

(57) ABSTRACT

A structure of a circuitry substrate for securing an area from tampering is disclosed. The structure includes a circuitry substrate with at least one of a top tamper enclosure and a bottom tamper enclosure covering a component in a protected area of the circuitry substrate. The top and bottom tamper enclosures are adhesively bonded to a surface of the circuitry substrate, and a tear initiation site is added to a side of the perimeter of circuitry substrate bordering the protected area that includes at least one tamper enclosure, such that the tear initiation site is located and configured to enable propagation of a delamination of at least one internal layer of the circuitry substrate and a severing of a security circuit when a removal force is applied to the at least one of the top tamper enclosure and the bottom tamper enclosure.

11 Claims, 5 Drawing Sheets

(56) References Cited

U.S. PATENT DOCUMENTS

| | | | |
|---|---|---|---|
| 8,815,706 B2* | 8/2014 | Hirschler | H01L 21/563 |
| | | | 438/464 |
| 9,578,764 B1* | 2/2017 | Fisher | H05K 3/10 |
| 9,721,199 B2 | 8/2017 | Salle | |
| 11,191,155 B1 | 11/2021 | Zhang et al. | |
| 11,570,887 B2* | 1/2023 | Huang | H05K 1/0231 |
| 2007/0177363 A1 | 8/2007 | Jayanetti | |
| 2008/0192446 A1 | 8/2008 | Hankofer et al. | |
| 2008/0278217 A1 | 11/2008 | Hankhofer et al. | |
| 2009/0109024 A1* | 4/2009 | Weidner | G06F 21/86 |
| | | | 340/540 |
| 2014/0306014 A1* | 10/2014 | Salle | G06K 19/02 |
| | | | 235/488 |
| 2019/0387617 A1 | 12/2019 | Dragone | |
| 2022/0328355 A1* | 10/2022 | Mackh | H01L 21/6836 |

FOREIGN PATENT DOCUMENTS

| | | |
|---|---|---|
| CN | 119998810 A | 5/2025 |
| EP | 2927762 B1 | 6/2020 |
| WO | 2010128939 A1 | 11/2010 |
| WO | 2021031570 A1 | 2/2021 |
| WO | 2024/078444 A1 | 4/2024 |

OTHER PUBLICATIONS

Intellectual Property Office, Patents Act 1977: Search Report under Section 17(5), Jun. 27, 2025, 6 Pages, GB Application No. 2506357.9.

* cited by examiner

TEARING SECURITY FEATURE OF PRINTED CIRCUIT SUBSTRATES

BACKGROUND

The present invention relates to the security of components of hardware circuit boards, and more specifically, to creating tear initiation sites for designated delamination in response to component enclosure tampering.

Printed Circuit Boards (PCBs) include circuitry and components that provide function and memory, and in some instances include proprietary technology. PCBs provide electrical circuitry connection between the components that include semiconductor chips that are connected to substrates that are in turn connected to the PCB, or the chips are directly connected to the surface of a PCB. PCB components also include, but are not limited to capacitors, resistors, fuses, and connectors. PCBs may be generically referred to as circuitized substrates or printed circuit substrates.

SUMMARY

According to one embodiment of the present invention, a structure of a circuitry substrate for securing an area from tampering and accessing the secure area is provided. The structure includes a circuitry substrate including at least one of a top tamper enclosure and a bottom tamper enclosure providing a security cover for a protected component in a protected area of the circuitry substrate. The structure includes a connection bonding the top tamper enclosure and/or the bottom tamper enclosure to the circuitry substrate, and the structure includes a tear initiation site added to a side of the circuitry substrate bordering a protected area that includes the at least one of the top tamper enclosure and the bottom tamper enclosure, wherein the tear initiation site is located and configured to enable the propagation of delamination of at least one internal layer of the circuitry substrate and the severing of a security circuit when a removal force is applied to the at least one of the top tamper enclosure and/or the bottom tamper enclosure.

According to another embodiment of the present invention, a method is provided for creating a tear initiation site disabling a protected area of a printed circuit board (PCB). The method receives a printed circuit board that includes one or more internal layers containing security circuits positioned in an area associated with protected components that receive tamper enclosures adhesively attached to the component and the surface of the PCB, such that severing one or more of the security trace circuits initiates a disabling of data and function of the protected components. The method determines the area associated with protected components that receive tamper enclosures, and the method creates a tear initiation site along a side of the PCB aligned with the area associated with the protected components.

According to another embodiment of the present invention, a method is provided for creating a disabling tear of a printed circuit board due to tamper attempts of a protected area of the printed circuit board. The method receives internal layers of a printed circuit board (PCB), wherein at least one layer of the PCB is reduced in size along a dimension of a side that includes a protected area of the PCB to which one or a combination of a top tamper enclosure and a bottom tamper enclosure is attached. The method bonds the internal layers, wherein the at least one internal layer reduced in size is positioned to form an inserted step along the dimension of the side of the protected area of the PCB, wherein the bonding of a first internal layer of regular size is bonded with reduced adhesion to at least one layer of the PCB that is reduced in size along a dimension of the side of the PCB.

DETAILED DESCRIPTION

Figure 1:
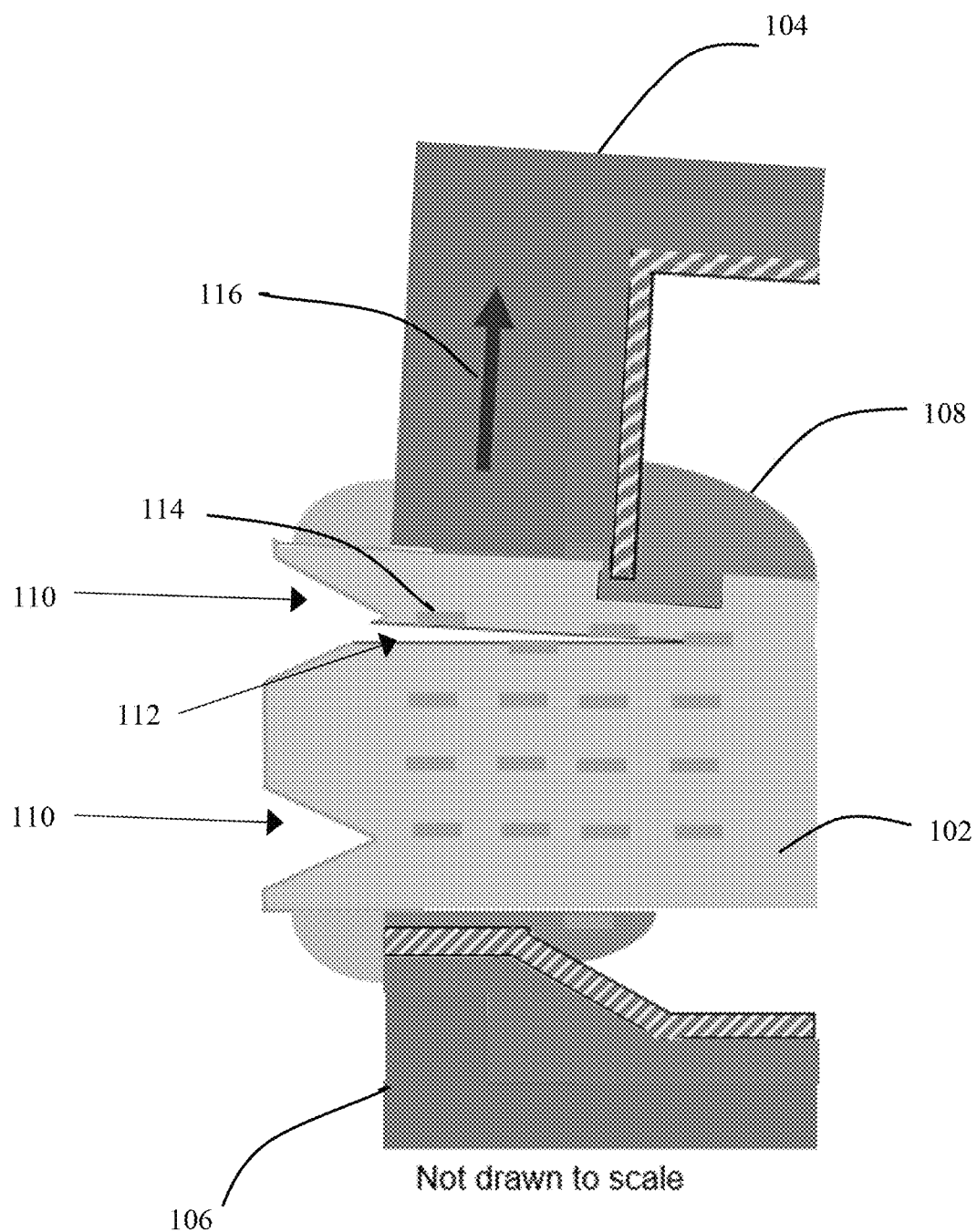
FIG. 1 is an example side view illustrating a printed circuit substrate cross-section including tear initiation sites and delamination, in accordance with an embodiment of the present invention.

Embodiments of the present invention recognize that components attached to printed circuit boards are often a target of unauthorized access, tampering, and attacks to obtain data, design, or function information associated with the targeted component. Often, targeted components include a tamper enclosure as security protection, however, malicious actors continuously pursue methods and techniques to overcome the enclosures and access the targeted component. In some cases, malicious actors attempt to determine cryptographic keys, steal secret designs, reverse engineer functions, access data, or gain network access behind firewalls. In other cases, the objective is to disable or sabotage a system.

Disclosed structures and techniques include the use of a security wrap constructed of tear-prone material and bonded to the component or "parent device" that includes the component and a tamper covering of the component. Disclosed structures and techniques utilize edge slits on the security wrap to promote tearing and rely on tearing of the security wrap to sever localized conductors, which may provide detection of tamper but leaves the component and substrate intact for malicious access. Additional disclosures include a groove or trench as a surface feature for enclosure attachment to a circuit board. Embodiments of the present invention provide structures, techniques, and a method for detection of tampering with component enclosures to initiate data removal or data scramble and create destructive delamination of internal circuits of printed circuit boards preventing functional access to data and/or function of the component or use of the component for network access to other components or features of the network. An aspect of the present invention includes enabling designated tearing and/or delamination of one or more printed circuit board layers that include security trace circuitry in response to a removal force applied to the tamper enclosure. The tearing or delamination of the PCB internal layer(s) results in a destructive action disabling the function of the targeted component and at least a portion of the PCB.

A printed circuit board (PCB) as referred to, herein, includes substrates with electronic circuitry on surfaces and/or in internal layers, with the internal layers bonded by a lamination method. A PCB, as referred to herein, may include printed circuit boards, printed circuit cards, or flex printed circuits. A tamper enclosure covers one or more components attached to a PCB by an adhesive bond to the component and/or the substrate to which the component is attached. A tamper enclosure may be constructed of metallic material, plastic material, or a ridged coating material. A dielectric material is used to create internal layers of PCBs and to bond the layers together. Plated vias, which connect one layer to another adjacent layer, and plated through holes, which may connect two or multiple layers of a PCB, make electrical connections between layers.

With reference now to Figures. The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure (FIG.) 1 illustrates an example side view of a printed circuit substrate cross-section including a tear initiation site and delamination, in accordance with an embodiment of the present invention. It should be noted that the term "tear initiation site," as used herein, includes features that, in some embodiments, extend parallel to internal layers of the PCB along the entire perimeter of the protected area, thus forming a fully secure perimeter and providing 360 degrees of protection against tampering of enclosed components of the PCB. The tear initiation site provides a weakened portion of bonding between layers of the PCB, corresponding to at least a portion of the perimeter of the protected area. The terms "tear point," "stress notch," and "tear initiation site" are therefore not limited to single point locations but include physical changes to the PCB enabling propagation of tearing and delamination along one or more edges of a protected area. Embodiments recognize that a parallel stress notch, trench, or tear initiation site may be created by a rotating blade, a router, a laser, and use of different size and/or bonding strength of internal layers forming separation edges or inserted steps on the sides of the circuitry substrate. In other embodiments, a tear initiation site may include a stress notch formed perpendicular to a side of the PCB.

FIG. 1 includes PCB 102, top tamper enclosure, sometimes referred to as a "top can," 104, bottom tamper enclosure, sometimes referred to as a "bottom can," 106, adhesive 108, parallel tear notch 110, delamination tear 112, security circuit 114 (sometimes referred to as a security trace), and tamper removal force 116 illustrated by an upward directed arrow. Embodiments acknowledge that not all instances of tamper enclosures include both a top and bottom tamper enclosure, but FIG. 1 illustrates both for clarity and completeness that both may be present in some embodiments. PCB 102 includes multiple internal circuitry layers and may include components connected to a surface of PCB 102. Components connected to the surface of PCB 102 (e.g., by solder connection) may be protected by bonding top tamper enclosure 104 and/or bottom tamper enclosure 106 to the respective surface of PCB 102, via adhesive 108. FIG. 1 illustrates PCB 102 as including multiple internal circuitry layers in the cross-section view. Tampering attempts to remove tamper enclosures result in delamination tear 112 of at least one internal layer of PCB 102 aligned with the positioning of an instance of parallel tear notch 110.

In some embodiments, creation of parallel tear notch 110 (i.e., a tear initiation site), includes without limitation, mechanically, chemically, or optically, removing material from a side of PCB 102 that aligns with a protected component attached to the surface of PCB 102. For example, parallel tear notch 110 is created by mechanical, chemical, or optical removal of material along a side of PCB 102. Adhesive 108 bonds top tamper enclosure 104 and bottom tamper enclosure 106 to a surface of PCB 102. In some embodiments, adhesive 108 also bonds top tamper enclosure 104 and bottom tamper enclosure 106 to the protected component (not shown). The illustrations of FIG. 1 include delamination tear 112 occurring at a layer bond that is aligned with one instance of parallel tear notch 110, and displacement and/or severing of security circuit 114 also results from delamination tear 112. Tamper removal force 116, depicted by the large arrow, represents a tampering effort to remove top tamper enclosure 104, which produces adequate force to cause delamination tear 112. In some embodiments, severing of security circuit 114 triggers actions that may include deletion or scrambling of data included in protected components, deactivation of PCB 102 from layer delamination, or other protective actions.

Figure 2:
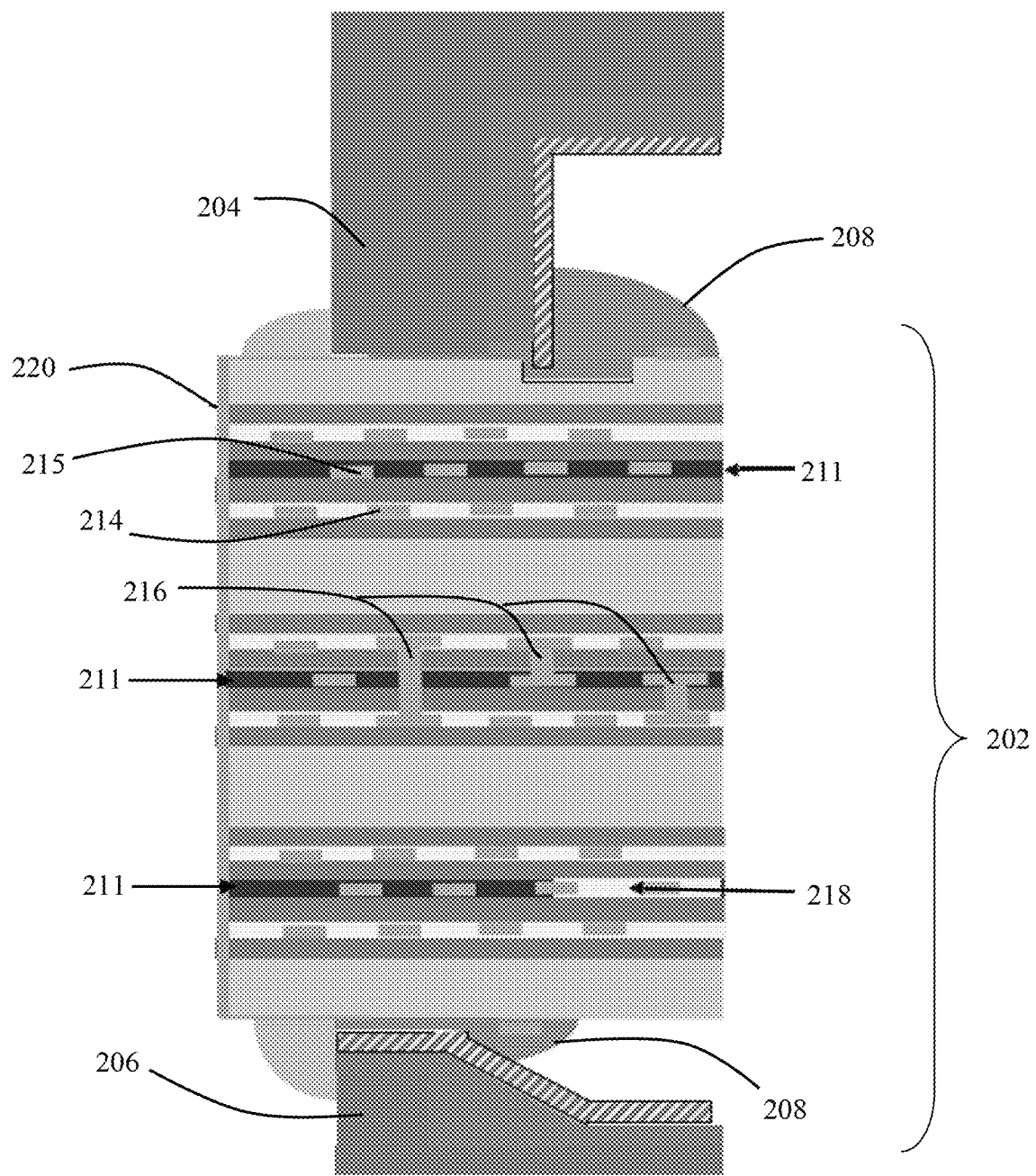
FIG. 2 is an example side view illustrating a printed circuit substrate cross-section including modified bonding of an internal layer, in accordance with an embodiment of the present invention.

FIG. 2 is an example side view illustrating a printed circuit substrate cross-section including modified bonding of internal layers, in accordance with an embodiment of the present invention. FIG. 2 depicts three different structural options that can be incorporated in a PCB, alone or in combination, to provide a tear initiation site within the PCB for tamper security. FIG. 2 includes PCB 202, top tamper enclosure 204, bottom tamper enclosure 206, adhesive 208, alternate dielectric material 211, internal circuit 214, security circuits 215 and 216, partially conditioned dielectric material 218, and edge plating 220.

Top tamper enclosure 204 and bottom tamper enclosure 206 form a protective cover of one or more components of PCB 202, similar to descriptions presented with respect to FIG. 1. Adhesive 208 provides a bond between the top and bottom tamper enclosures 204, 206, and the respective surfaces of PCB 202. In embodiments of the present invention, alternate dielectric material 211 forms a weaker layer-to-layer bond providing a selective separation point of failure of PCB 202 as a result of a removal force of tampering of at least one of top tamper enclosure 204 and bottom tamper enclosure 206. The layer separation due to delamination of alternate dielectric material 211, resulting from a removal tampering force, causes severing of security circuit 215, depicted in cross-section. Security circuit 216 includes plated vias and a through-hole to other layers of PCB 202, which become severed by the delamination of alternate dielectric material 211 due to a removal tampering force applied to top tamper enclosure 204 and/or bottom tamper enclosure 206. The weaker bonding of alternate dielectric material 211 establishes a designated separation point within the protected area of the PCB that includes security circuits that when severed or broken initiate response actions, such as clearing of memory, random setting of circuit bits, and/or disabling function of protected components.

Partially conditioned dielectric material 218 includes surface characteristics that reduce the bond strength of portions of the dielectric material between layers of PCB 202. Partially conditioned dielectric material 218 may include the same material as other dielectric material in layers of PCB 202, however, partially conditioned dielectric material 218 has received surface processing operations that intentionally reduce bonding to other layers during lamination processes at designated outside portions of the dielectric material that correspond to the perimeter areas of protected components of PCB 202. The "partially conditioned" nature of partially conditioned dielectric material 218 results in specific areas of separation intended to correspond to security circuits that are broken or severed in response to a removal force applied to a tamper enclosure of PCB 202, such as top tamper enclosure 204 and/or bottom tamper enclosure 206. Partially conditioned dielectric material 218 promotes tearing of PCB 202 in a pre-designated area but avoids tearing in other areas internal to PCB 202.

In an alternative embodiment, a selective micro etch operation performed on the outside perimeter of the protected area of PCB 202 reduces the thickness of edge plating 220, providing weaker points for the initiation of tearing and separation of PCB 202, aligned with security circuits. Edge plating 220 provides shielding protection for electromagnetic compatibility (EMC) of PCB signals, avoiding intolerable electromagnetic interference (EMI) effects, or excess radiation of signals generated by circuits within the tamper enclosure. Embodiments recognize edge plating 220 as having a thickness that may inhibit the intended layer separation for tampering protection. Embodiments include actions to weaken edge plating 220 in areas designated for tearing or separation due to tampering forces. In one embodiment, a combination of alternate dielectric material 211 and parallel tear notch 110 may be applied to weaken the effect of edge plating 220 and enable tearing and delamination between designated layers of the perimeter of PCB 202. In another embodiment, application of an etching operation to the perimeter area corresponding to the designated delamination layer, results in reduced plating thickness. In yet another embodiment, etching operations completely remove edge plating 220 from a perimeter area corresponding to a designated delamination or tearing layer. The inclusion of stitching vias in the areas with an absence of edge plating 220 provides an EMC seal instead of edge plating 220.

Figure 3A:
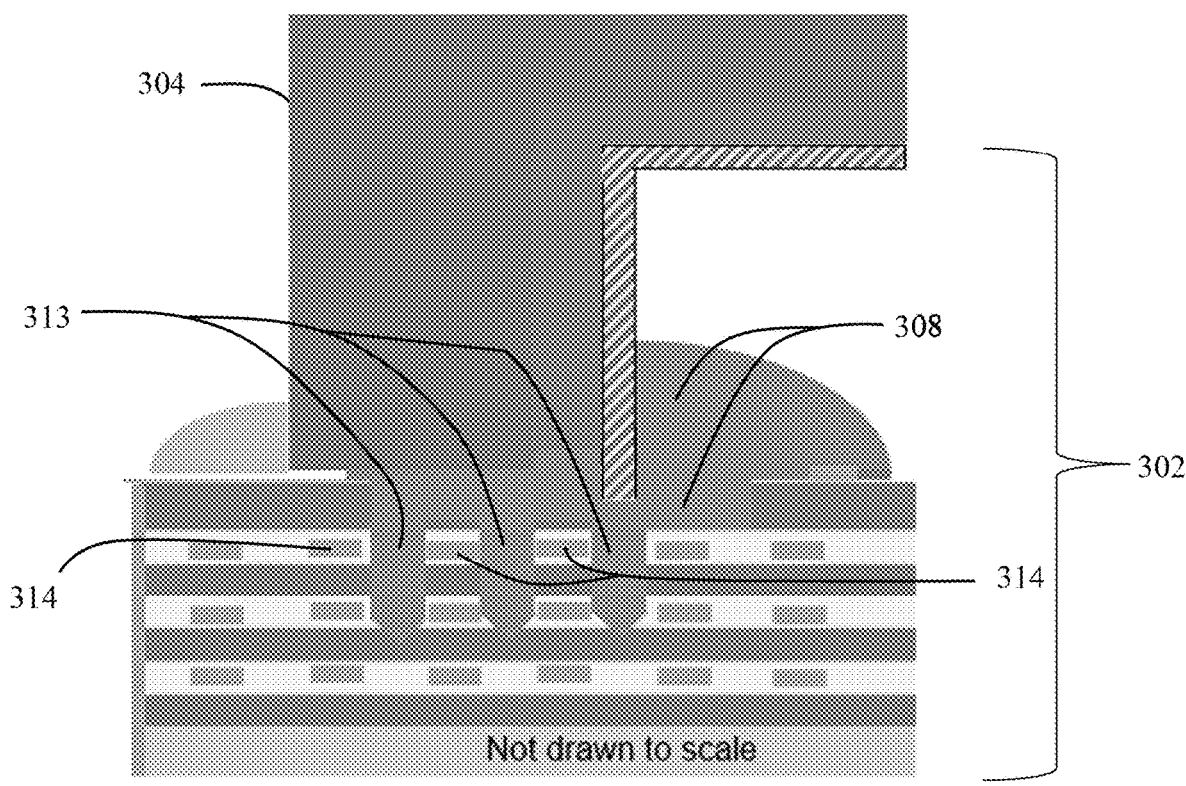
FIG. 3A is an example side view illustrating a printed circuit substrate cross-section including adhesive-filled trenches adjacent to internal circuit traces, in accordance with an embodiment of the present invention.

FIG. 3A provides an example side view illustrating a printed circuit substrate cross-section including adhesive-filled trenches adjacent to internal circuit traces, in accordance with an embodiment of the present invention. FIG. 3A includes PCB 302, top tamper enclosure 304, adhesive 308, adhesive-filled trenches 313, and security circuits 314. In some embodiments, a surface section of PCB 302 aligning with areas of attachment of top tamper enclosure 304 receives trench structures ("trenches") that extend from the surface into internal layers of the PCB. Top tamper enclosure 304 provides a physical covering of protected components (not shown) of PCB 302. Adhesive 308 bonds top tamper enclosure 304 to a surface of PCB 302. Embodiments include the removal of dielectric material between internal circuit traces forming trenches along at least a portion of a protected area in which adhesive 308 bonds top tamper enclosure 304 and PCB 302. Adhesive-filled trenches 313 result from adhesive 308 filling the trench structures that may extend to one or more internal layers of PCB 302. The position and dimensions of adhesive-filled trenches 313 enable a proximity to security circuits 314 of internal layers of PCB 302. Security circuits 314 are broken or severed as a result of a removal force applied to top tamper enclosure 304 bonded to PCB 302 and adhesively filled trenches 313 by adhesive 308. The removal force results in tearing between layers of PCB 302 associated with adhesively filled trenches 313 and severing of security circuits 314, initiating pre-determined actions to protect components covered by top tamper enclosure 304 of PCB 302.

Figure 3B:
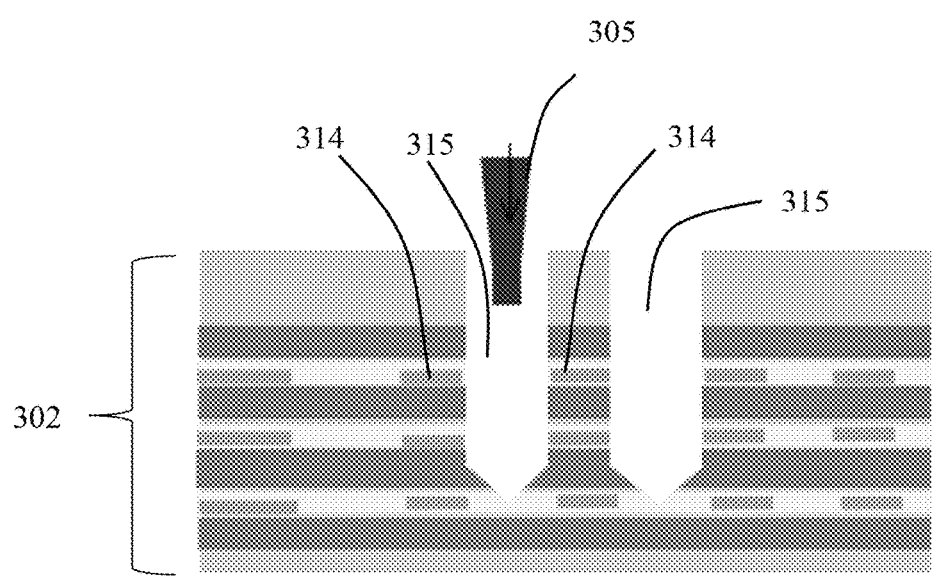
FIG. 3B is an example side view illustrating a printed circuit substrate cross-section including laser-drilled trenches adjacent to internal circuit traces, in accordance with an embodiment of the present invention.

FIG. 3B is an example side view illustrating a printed circuit substrate cross-section including laser-drilled trenches positioned adjacent to internal circuit traces, in accordance with an embodiment of the present invention. FIG. 3B includes PCB 302, laser 305, security circuit 314, and surface trenches 315. In an embodiment of the present invention laser 305, configured as a laser drilling device for removal of organic material from dielectric materials used in fabricating multilayer printed circuit boards, generates trenches 315. Laser 305 includes parameters of power level, beam diameter, and duration time to generate a surface trench of a designated width, depth, and length of the protected area of PCB 302 corresponding to adhesive bonding sites of top tamper enclosure 304 (FIG. 3A). FIG. 3B depicts surface trenches 315 prior to filling by adhesive 308 (FIG. 3A). FIG. 3B depicts the removal of adequate dielectric material such that trenches 315 are in close proximity to security circuits 314 and, in some embodiments, allow bonding of adhesive 308 to the sides of security circuits 314 rather than bonding to a surface layer. The additional bonding surface area provides an additional amount of tearing and delamination of PCB 302 and severing of security circuits 314 due to a removal level of force applied to tamper enclosures (i.e., top tamper enclosure 304, FIG. 3A).

Figure 4A:
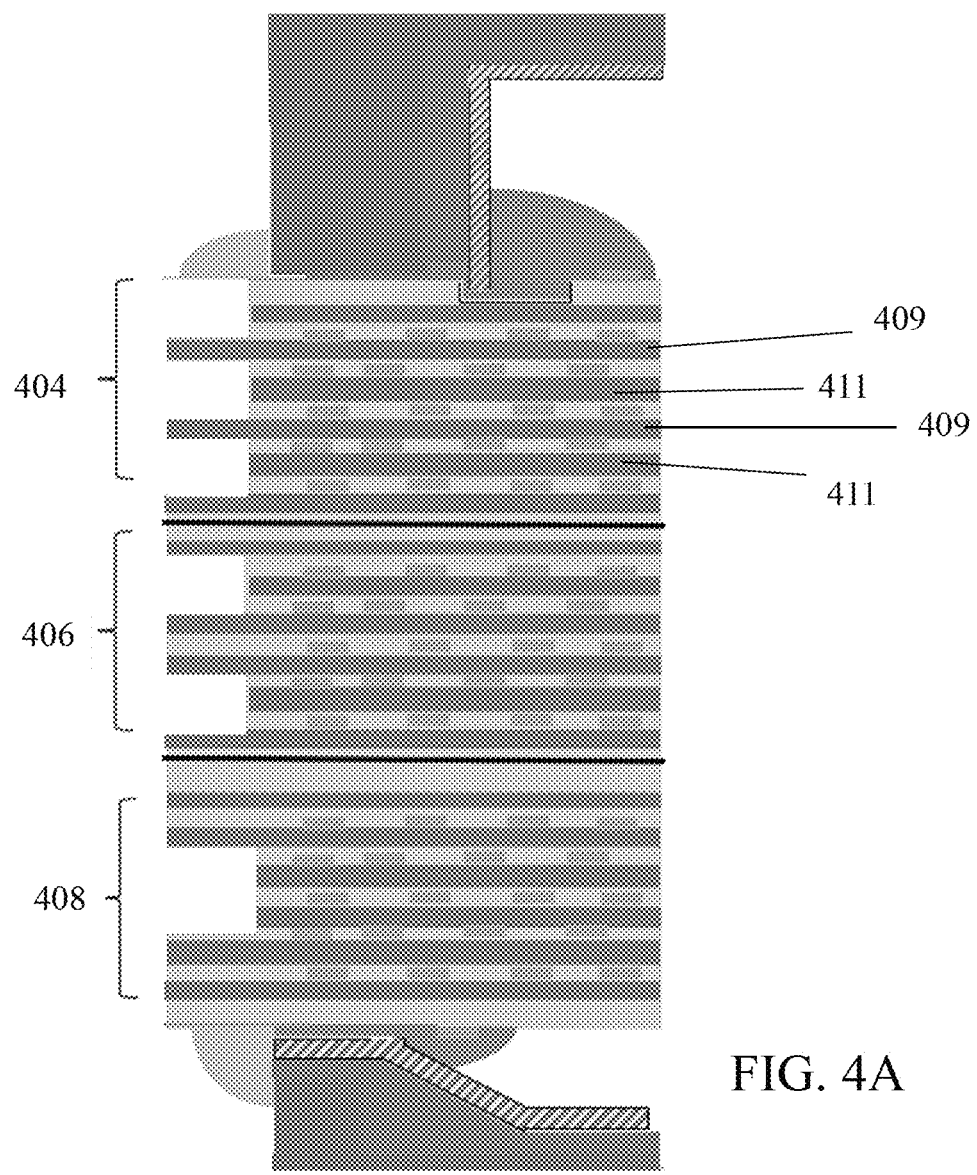
FIG. 4A is an example side view illustrating a cross-section including three optional versions of step-like insert structures on a side of the printed circuit substrate, in accordance with an embodiment of the present invention.

FIG. 4A is an example side view illustrating a cross-section including stepped structures formed on a side of the printed circuit substrate, in accordance with an embodiment of the present invention. Embodiments form step-like structures on a side of a PCB by use of internal layers cut to a different size. The resulting step structures create tear initiation sites caused by areas of stress concentration in which delamination tearing preferentially occurs due to applied forces attempting to remove a tamper enclosure covering a protected component. In an embodiment of the present invention, the bonding of different-sized internal layers of a PCB to regular-sized layers of the PCB form a step structure along the PCB side. For example, a first internal layer having a shorter dimension along a side of the PCB than a surface layer and a layer below the first internal layer may be bonded together with the surface layer and lower layer (e.g., laminated) forming a step-like structure that introduces an area of stress concentration for separation of layers for the PCB.

FIG. 4A depicts three optional versions of step-like insert structures and each option can be used in a single instance, multiple instances, or in combinations in any order. FIG. 4A includes alternating step structure 404, strategically placed step structure 406, and multi-layer step structure 408. FIG. 4A also includes regular-sized internal layers 409 and smaller-sized internal layers 411. In an embodiment, smaller-sized internal layers 411 have shorter dimensions in the periphery of a protected area of the PCB. Alternating step structure 404 forms areas of stress concentration due to step-like structures formed by alternating sizes of layers. Strategically placed step structure 406, in one embodiment, includes the formation of step structures at pre-determined, strategically placed layers, such as specific layers that include security circuits to detect tearing and delamination of the PCB due to removal force applied to tamper enclosures. Multi-layer step structure 408 illustrates the formation of a step structure that includes multiple internal layers having a different size (i.e., shorter length with respect to a side area of the PCB) bonded between multiple layers having a larger size in the dimension of the side area of the PCB. It should be noted that FIG. 4A depicts three different formations of step-like structures on a side of a PCB as a convenient example, and embodiments may include only one, or any combination of step structures in applying tear initiation site structures to the perimeter of protected areas of PCBs.

Figure 4B:
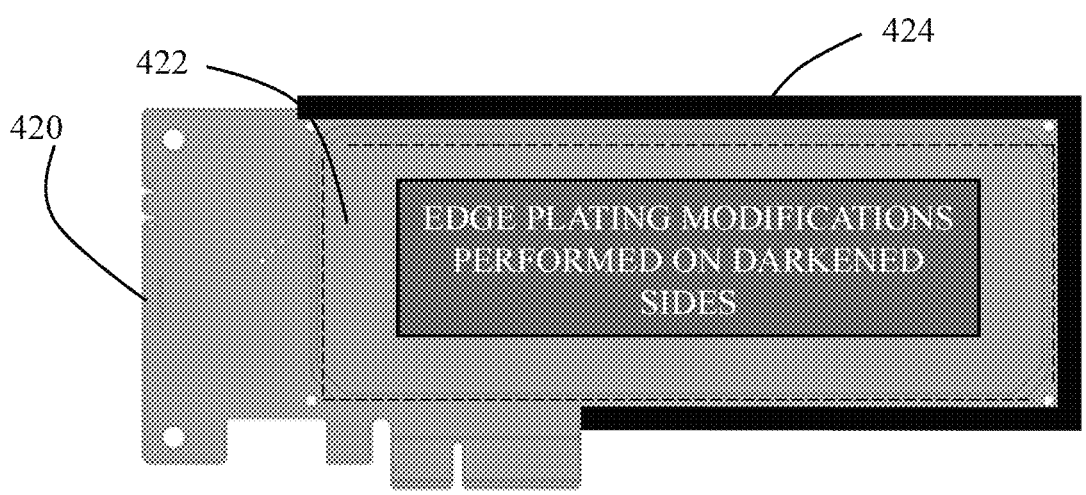
FIG. 4B is an example top view illustration of a printed circuit substrate

FIG. 4B is an example top view illustration of a printed circuit substrate with a top tamper enclosure covering a protected area, in accordance with an embodiment of the present invention. FIG. 4B includes PCB 420, top tamper enclosure 422, and edge plating modification area 424. Top tamper enclosure 422 covers protected components (not shown) of PCB 420. The darkened edge depicting edge plating modification area 424 borders the outer edge of top tamper enclosure 422 on three sides and edge plating modification area 424 includes step structure stress points along the three side edges of PCB 420, parallel to the internal layers. Embodiments include the performance of operations to edge plating modification area 424 to reduce or eliminate edge plating from the external area of the step structures. In some embodiments, etching operations, or other processing methods, perform removal of all edge plating. In other embodiments, reduction of edge plating thickness weakens the connections between layers included in the step structure, further enabling tearing and delamination due to removal force applied to top tamper enclosure 422. In some embodiments, a viscous adhesive could be used in the bonding of step structure layers to prevent the adhesive from providing stronger laminating strength to the internal layers and canceling the benefit of the step structures.

Figure 5:
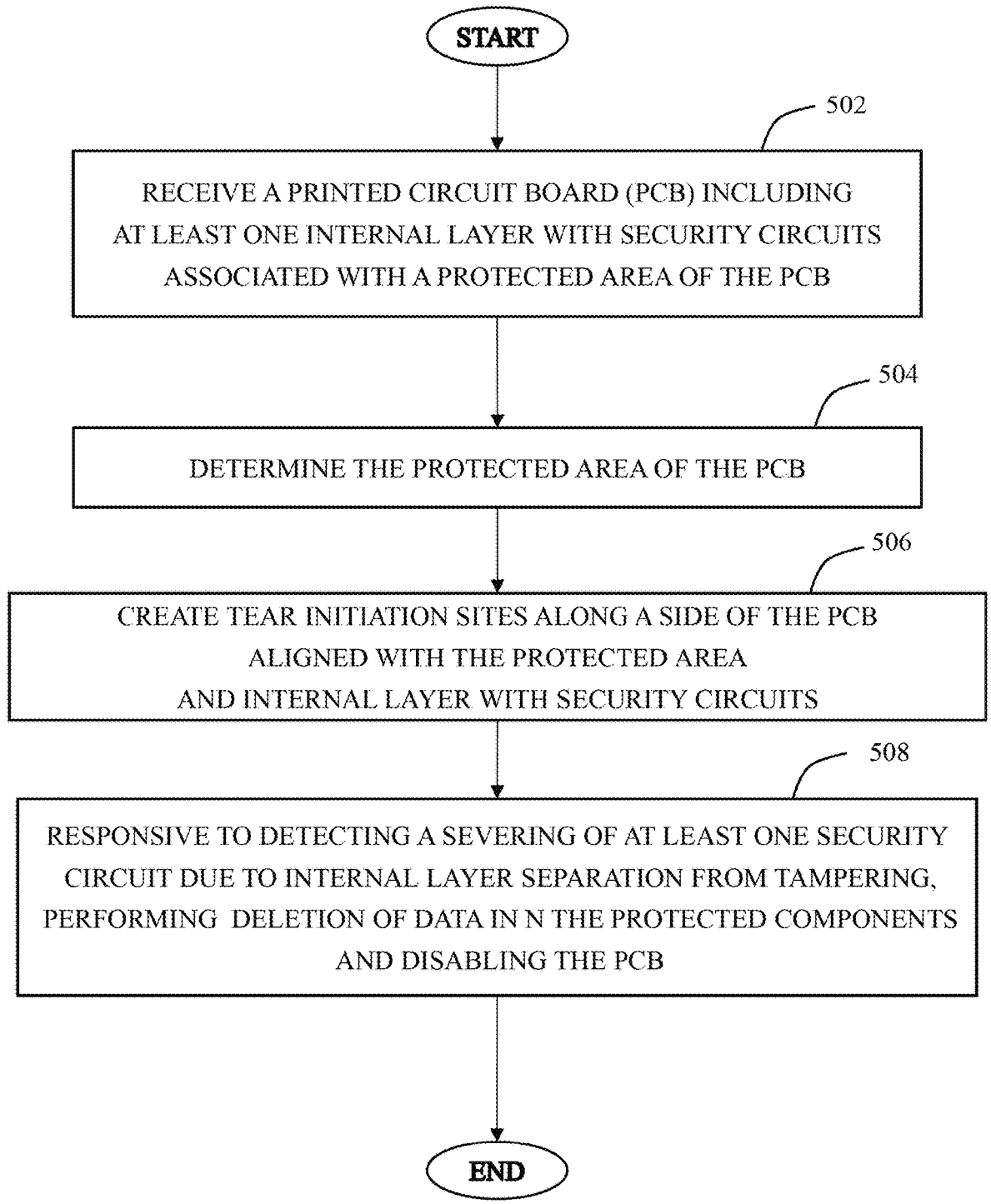
FIG. 5 is a flow chart diagram depicting operational steps for a tamper protection process 500, in accordance with an embodiment of the present invention.

FIG. 5 is a flow chart diagram depicting operational steps for a tamper protection process 500, in accordance with an embodiment of the present invention. Tamper protection process 500 receives a printed circuit board (PCB) (also referred to as a printed circuit substrate) that includes at least one internal layer with security circuits associated with a protected area of the PCB (step 502). Embodiments include receipt of a PCB that has been processed through operations that have bonded internal layers and surface layers forming the PCB. The received PCB includes at least one area designated as a protected area in which components will be surface mounted and covered with a tamper enclosure to protect access and attack of the components. Positioning of the security circuits in at least one internal layer of the PCB includes corresponds to the outer edges of the protected area and, when severed, initiate actions to protect the data and functionality of the protected components, such as clearing or scrambling data stored in the protected components, and/or disabling functionality and response of the component as a result of access or attack Embodiments determine the position of the protected area of the PCB (step 504). Embodiments examine the received PCB to accurately determine the protected area of the PCB, and in some embodiments, more than one protected area may be present. Embodiments identify the outer edges associated with the position of the protected area and obtain information regarding the specific layer designated for enabled tearing and delamination. The specific layer information includes a distance from a surface of the PCB to the internal layer designated for tearing and delamination and bonded to security circuits to accurately locate tear initiation sites along PCB edges associated with the protected area. For example, embodiments determine the dimensions of a protected area and the outer edges adjacent to the protected area and further determine the location of the internal layer designated for tearing and bonded to security circuits at a determined distance from the top surface of the PCB.

Embodiments create tear initiation sites along one or more sides of the PCB aligned with the protected area and internal layer associated with security circuits (step 506). Embodiments physically create tear initiation sites along the side of the PCB and parallel to the internal layers of the PCB. In some embodiments, the creation and positioning of tear initiation sites align with the designated internal layer bonded to security circuits. Tear initiation sites can include physically removing material along the side of the PCB adjacent to the protected area, for example, by mechanical, chemical, optical, or other material removing processes. Embodiments include tear initiation sites formed by the use of different dielectric material in a designated internal layer, which includes a lower bonding strength that enables tearing and delamination at the designated layer. Embodiments can also include surface conditioning of the perimeter of the protected area of a designated internal layer such that surface conditioning performs a treatment that lowers the bonding strength of the internal layer to other layers of the PCB and enables tearing and delamination at the designated layer. Embodiments can include the use of internal layers of different sizes to form a step structure along an outside edge of the protected area of the PCB. The step-like structure creates an area of stress concentration favoring tearing or delamination at the step and may be further enabled by etching of the edge plating along the outside edge of the PCB corresponding to the step structures. Embodiments may include performing operations that weaken a portion of edge plating or selectively remove all edge plating aligned with step structure and include stitching vias within the internal layers to provide electromagnetic compatibility (EMC) function for the PCB in the area of the step structure.

In response to detecting a severing of at least one security circuit due to internal layer tearing from tampering, embodiments perform actions protecting access to data in components and disabling functionality of the PCB (step 508). Embodiments acknowledge that subsequent to creating tear initiation sites in the PCB, additional PCB processing results in surface populated components and tampering enclosures adhesively covering components to be protected. Components of PCBs may be protected to prevent access to cryptographic keys, or other data that may be included or stored in the component. Embodiments recognize that components may be protected against attack to monitor the functionality of the component gaining information assumed secure. Embodiments also recognize that access to a functioning component may enable otherwise unavailable network access.

Embodiments detect the severing of a security circuit as a result of a removal force applied to a tamper enclosure covering the protected component adhesively bonded to the surface of the PCB. The removal force produces delamination at a tear initiation site associated with the protected area and causes the initiation of pre-determined actions protecting access to data and disabling the functionality of the PCB to prevent access to other components, other PCBs or network access that overcomes protective firewalls.

It should be noted that in some embodiments, breaking or severing of security circuits may in addition trigger an alarm or notice to appropriate responders. Embodiments may include combinations of tear initiation sites, different dielectric materials, edge plating reduction or removal, different size internal layers, and applying surface conditioning processes to protected area perimeters on internal layers.

What is claimed is:

1. A structure comprising:
a circuitry substrate including a least one of a top tamper enclosure and a bottom tamper enclosure;
a connection bonding the at least one of the top tamper enclosure and the bottom tamper enclosure to the circuitry substrate; and
a tear initiation site extending along at least a portion of a perimeter of a protected area of the circuitry substrate that includes the at least one of the top tamper enclosure and the bottom tamper enclosure, wherein the tear initiation site is located and configured to enable propagation of a delamination of at least one internal layer of the circuitry substrate and a severing of a security circuit when a removal force is applied to the at least one of the top tamper enclosure and the bottom tamper enclosure and includes a change of dielectric material having a reduced bond strength to other layers of the circuitry substrate.

2. The structure of claim 1, wherein the tear initiation site includes creating a notch on a side of the substrate corresponding to the top and bottom tamper enclosure and the notch of the tear initiation site is parallel to the at least one internal layer of the circuitry substrate.

3. The structure of claim 1, wherein the tear initiation site includes creating a notch on a side of the substrate corresponding to the top and bottom tamper enclosure in which the notch of the tear initiation site is perpendicular to the at least one internal layer of the circuitry substrate.

4. The structure of claim 1, wherein one or a combination of vias and through holes as security circuits between layers of the circuitry substrate that correspond to the tear initiation site.

5. The structure of claim 1, wherein a dielectric material providing a weaker layer-to-layer bond is used for one or more internal layers, enabling delamination from the removal force that is applied to the at least one of the top tamper enclosure and the bottom tamper enclosure.

6. The structure of claim 1, wherein the tear initiation site includes creating a trench into which an adhesive is applied increasing a bond strength connecting the top tamper enclosure or the bottom tamper enclosure to layers of the circuitry substrate, wherein the trench extends from a surface of the circuitry substrate adjacent to an internal layer security circuit designated for delamination upon physical tampering.

7. The structure of claim 1, wherein the tear initiation site includes reducing a bond strength of the at least one internal layer of the circuitry substrate by applying a surface treatment to the perimeter of the protected area of the circuitry substrate.

8. The structure of claim 1, wherein an edge plating is removed and stitching vias are used along edge areas to provide electromagnetic compatibility (EMC) shielding.

9. The structure of claim 1, wherein a trench is created by a removal of organic material and allows adhesive bonding to a side of security traces on multiple internal layers of the circuitry substrate.

10. The structure of claim 1, wherein the tear initiation site is created by at least one physical action selected from a group consisting of a stress notch created by a blade, the stress notch created by a router, the stress notch created by a laser, a trench created by the laser, the trench created by the router, and different size internal layers forming alternating indented steps at least a side of the circuitry substrate.

11. The structure of claim 1, wherein the severing of a security trace circuit initiates at least one of actions from a group consisting of deletion of data from a component within at least one of the top tamper enclosure and the bottom tamper enclosure and disabling of the circuitry substrate.

* * * * *